(12) United States Patent
Uchida

(10) Patent No.: US 6,492,660 B2
(45) Date of Patent: Dec. 10, 2002

(54) SEMICONDUCTOR LIGHT EMITTING DEVICE

(75) Inventor: Shiro Uchida, Miyagi (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/765,580

(22) Filed: Jan. 22, 2001

(65) Prior Publication Data

US 2001/0010373 A1 Aug. 2, 2001

(30) Foreign Application Priority Data

Jan. 24, 2000 (JP) .................................... P2000-014289

(51) Int. Cl.[7] .............................................. H01L 27/15
(52) U.S. Cl. ........................................ 257/79; 257/94
(58) Field of Search .............................. 257/94; 372/45, 372/46

(56) References Cited

U.S. PATENT DOCUMENTS 6,067,309 A * 5/2000 Onomura et al. ............. 372/46
6,172,382 B1 * 1/2001 Nagahama e tal. ........... 257/94
6,252,894 B1 * 6/2001 Sasanuma et al. ............ 372/45

* cited by examiner

Primary Examiner—David Nelms
Assistant Examiner—Thinh T Nguyen
(74) Attorney, Agent, or Firm—Rader, Fishman & Grauer PLLC; Ronald P. Kananen, Esq.

(57) ABSTRACT

A semiconductor light emitting device includes a cladding layer having a first conductive type, an active layer, and a semiconductor layer including at least a cladding layer and having a second conductive type reversed to the first conductive type, which layers are sequentially stacked on a substrate; wherein a ridge is formed on part of an upper portion of the semiconductor layer; each of the cladding layer having the first conductive type, the active layer, and the semiconductor layer having the second conductive type is made from a nitride based group III–V compound semiconductor; and the width of the ridge is in a range of 1.9 to 2.6 μm. The semiconductor light emitting device is stably operable with an output of about 30 mW by setting a threshold current to 100 mA or less and also setting a horizontal angle to 6° or more.

14 Claims, 3 Drawing Sheets

SEMICONDUCTOR LIGHT EMITTING DEVICE

BACKGROUND OF THE INVENTION

The present invention relates to a semiconductor light emitting device and a fabrication method thereof, and particularly to a semiconductor light emitting device used for a semiconductor laser or a light emitting diode using a nitride based compound semiconductor allowing light emission of violet light and a fabrication method thereof.

A semiconductor laser device allowing light emission of violet light has become a focus of attention as a light source for optical disk systems. As a semiconductor light emitting device using a nitride based compound semiconductor allowing light emission of violet light, there is known a gallium nitride based semiconductor laser device disclosed in Japanese Patent Laid-open No. Hei 11-214788. In this gallium nitride based semiconductor laser device, an active layer made from a nitride semiconductor held between at least cladding layers made from nitride semiconductors is provided on a substrate, wherein a current is injected in a stripe region (which is called a ridge) having a width narrower than that of the active layer. This laser device is characterized in that the ridge width is specified to be in a range of 0.2 to 1.8 $\mu$m.

The above-described related art semiconductor laser device, however, is disadvantageous in that since the ridge width is in the range of 0.2 to 1.8 $\mu$m, the current consumption becomes as large as 100 mA or more. For example, a semiconductor light emitting device used for a short wavelength digital video disk recording apparatus requires an output of about 30 mW, and to stably operate the semiconductor light emitting device, it is required to reduce the current consumption to 100 mA or less and also to reduce the power consumption.

SUMMARY OF THE INVENTION

An object of the present invention is to provide a semiconductor light emitting device stably operable with an output of about 30 mW by setting a threshold current to 100 mA or less and also setting a horizontal angle to 6° or more, and to provide a fabrication method thereof.

To achieve the above object, there is provided a semiconductor light emitting device including: a cladding layer having a first conductive type, an active layer, and a semiconductor layer including at least a cladding layer and having a second conductive type reversed to the first conductive type, which layers are sequentially stacked on a substrate; wherein a ridge is formed on part of an upper portion of the semiconductor layer; each of the cladding layer having the first conductive type, the active layer, and the semiconductor layer having the second conductive type is made from a nitride based group III–V compound semiconductor; and the width of the ridge is in a range of 1.9 to 2.6 $\mu$m.

As a result of experiments performed by the present inventor, it was found that, for the semiconductor light emitting device of present invention in which the ridge width is in the range of 1.9 to 2.6 $\mu$m, the power consumption necessary for obtaining an output of 30 mW becomes about 0.6 W or less and the current consumption necessary for obtaining the output of 30 mW becomes about 100 mA or less, and for a semiconductor light emitting device in which the ridge width is narrower than 1.9 $\mu$m or wider than 2.6 $\mu$m, the current consumption becomes more than 100 mA and thereby the device becomes unusable, and also the power consumption becomes rapidly larger.

According to the semiconductor light emitting device of the present invention having the above-described configuration, since the ridge width is in the range of 1.9 to 2.6 $\mu$m, it is possible to realize a semiconductor laser device allowing light emission of violet light, characterized in that an emission efficiency, expressed by a threshold current, is as low as 100 mA or less, and also to realize a semiconductor laser device allowing light emission of violet light, characterized in that a horizontal angle (a half-value of a far-field pattern in the horizontal direction) is 6.0° or more.

DETAILED DESCRIPTION OF THE PREFERRED EMBODIMENT

Hereinafter, a preferred embodiment of the present invention will be described with reference to the accompanying drawings.

Figure 1:
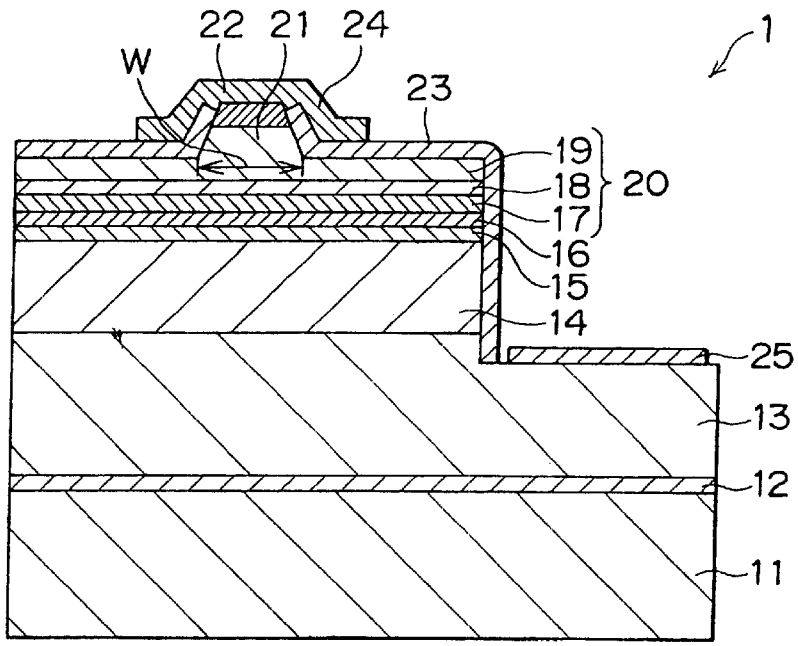
FIG. 1 is a sectional view showing a schematic configuration of an embodiment of a semiconductor light emitting device of the present invention.

FIG. 1 is a sectional view showing a schematic configuration of a semiconductor light emitting device configured in accordance with the embodiment of the present invention. As shown in FIG. 1, a buffer layer 12 and a contact layer 13 having a first conductive type (hereinafter taken as an n-type) are sequentially stacked on a substrate 11 made from sapphire. The buffer layer 12 is formed of an undoped gallium nitride (GaN) film having a thickness of 30 nm. The n-type contact layer 13 is formed of an n-type gallium nitride (n-GaN) film doped with an n-type impurity, typically, silicon, which film has a thickness of 4.5 $\mu$m.

An n-type cladding layer 14, an n-type guide layer 15, an active layer 16, a p-type cap layer 17, a p-type guide layer 18, and a p-type cladding layer 19 are sequentially stacked in this order on a specific region of the n-type contact layer 13. These layers 14, 15, 16, 17, 18, and 19 are formed into a specific mesa shape.

The n-type cladding layer 14 is formed of an n-type gallium aluminum nitride (n-AlGaN, where composition of Al: 0.08) film doped with an n-type impurity, typically, silicon at a concentration of about $5 \times 10^{18}/cm^3$, which film has a thickness of 1.3 $\mu$m. The n-type guide layer 15 is formed of an n-type gallium nitride (n-GaN) film doped with an n-type impurity, typically, silicon at a concentration of about $5 \times 10^{18}/cm^3$, which film has a thickness of 10 nm.

The active layer 16 has a multi-quantum well structure composed of n-type indium gallium nitride (n-Ga$_{1-x}$In$_x$N) films as well layers and undoped indium gallium nitride (undoped $Ga_{1-y}In_yN$) films as barrier layers. For example, the well layer is configured as the n-type indium gallium nitride (n-$Ga_{1-x}In_xN$, where x=0.14) film doped with silicon, which film has a thickness of 3.5 nm, and the barrier layer is configured as the undoped indium gallium nitride (undoped $Ga_{1-y}In_yN$, where y=0.02) film, which film has a thickness of 7.5 nm. In this multi-quantum well structure, the well number is typically set to 3.

The p-type cap layer 17 is formed of a p-type gallium aluminum nitride (p-AlGaN, where the composition of Al is 0.2) film doped with a p-type impurity, typically, magnesium, which film has a thickness of 20 nm. The cap layer 17 is desirable to be formed but may not be necessarily formed.

The p-type guide layer 18 is formed of a p-type gallium nitride (p-GaN) film doped with a p-type impurity, typically, magnesium at a concentration of about $5\times10^{19}/cm^3$, which film has a thickness of 100 nm. At this time, the concentration of carriers becomes typically about $5\times10^{17}/cm^3$.

The p-type cladding layer 19 is formed of a gallium aluminum nitride (p-AlGaN) film doped with a p-type impurity, typically, magnesium at a concentration of about $8\times10^{19}/cm^3$, which film has a thickness of 1.0 μm. At this time, the concentration of carriers becomes typically about $8\times10^{17}/cm^3$.

Part of an upper portion of the p-type cladding layer 19 is formed into a stripe ridge shape, which part is hereinafter referred to as "ridge 21". The width of the ridge 21 is in a range of 1.9 μm to 2.6 μm, preferably, 2.0 μm to 2.4 μm.

Figure 2:
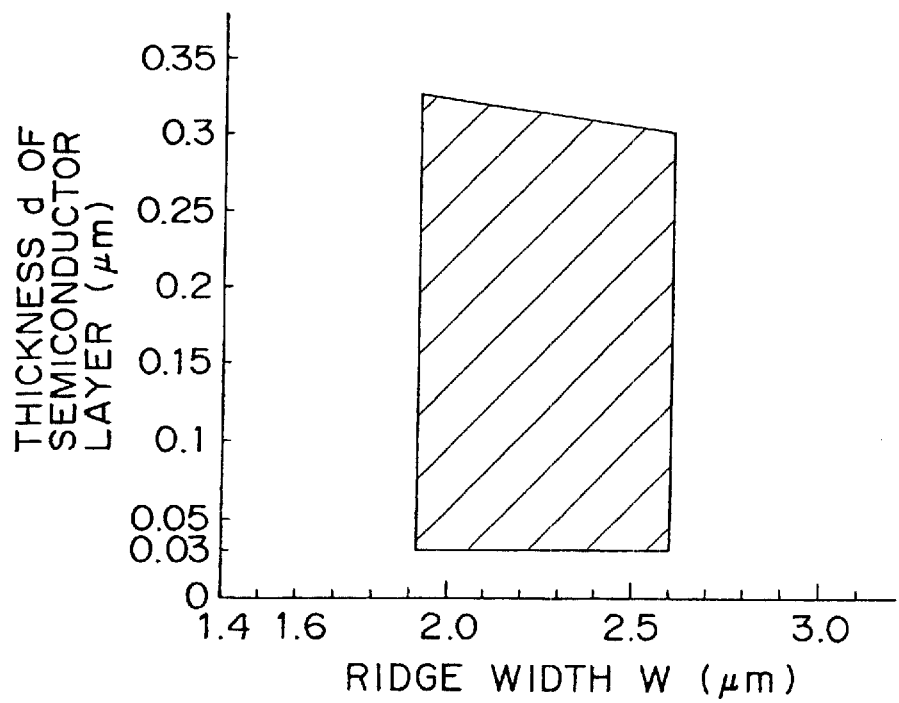
FIG. 2 is a graph showing an allowable range of a thickness of portions, on both sides of a ridge, of a semiconductor layer and an allowable range of a ridge width.

A thickness "d" of portions, present on both sides of the ridge 21 and on the active layer 16, of a p-type semiconductor layer 20 (composed of the p-type cap layer 17, p-type guide layer 18, and p-type cladding layer 19 in this embodiment) is, as will be described in detail later, set in a range shown by hatching in FIG. 2 from the viewpoint of obtaining a suitable threshold current $I_{th}$. For example, with the ridge width W=1.9 μm, the thickness "d" is in a range of 0.03 to 0.33 μm, and with the ridge width W=2.6 μm, the thickness "d" is in a range of 0.03 to 0.295 μm.

A p-type contact layer 22 formed of a gallium nitride (p-GaN) film having a thickness of 100 nm is provided on the ridge 21. A current blocking layer 23 is formed on the p-type cladding layer 19 in such a manner that an upper portion of the p-type contact layer 22 is opened. The current blocking layer 23 is made from a material which is capable of blocking a current from flowing therein from the underlying semiconductor layer 20 (particularly, the p-type cladding layer 19) and which has a refractive index of 2.5 or less. Specific examples of the materials may include silicon oxide ($SiO_2$), zinc oxide (ZnO), zirconium oxide ($ZrO_2$), silicon oxynitride (SiON), hafnium oxide ($HfO_2$), scandium oxide ($Sc_2O_3$), yttrium oxide ($Y_2O_3$), magnesium oxide (MgO), aluminum oxide ($Al_2O_3$), thorium oxide ($ThO_2$), bismuth oxide ($Bi_2O_3$), silicon nitride (SiN), aluminum nitride (AlN), and a gallium aluminum nitride (n-$Al_xGa_{1-x}N$, $x \geq 0.02$).

A p-type electrode 24 is provided on the current blocking layer 23 in such a manner as to be connected to the ridge 21. The p-type electrode 24 is formed by stacking a nickel (Ni) film (thickness: 10 nm), a platinum (Pt) film (thickness: 100 nm), and a gold (Au) film (thickness: 300 nm) in this order on the current blocking layer 23. An n-type electrode 25 is provided on the n-type contact layer 13. The n-type contact electrode 25 is formed by stacking a titanium (Ti) film (thickness: 10 nm), an aluminum (Al) film (thickness: 100 nm), a platinum (Pt) film (thickness: 100 nm), and a gold (Au) film (thickness: 300 nm) in this order on the n-type contact layer 13.

The semiconductor light emitting device 1 is thus obtained.

The reason why the ridge width W in the semiconductor light emitting device 1 is limited will be described with reference to FIGS. 3 to 5.

Figure 3:
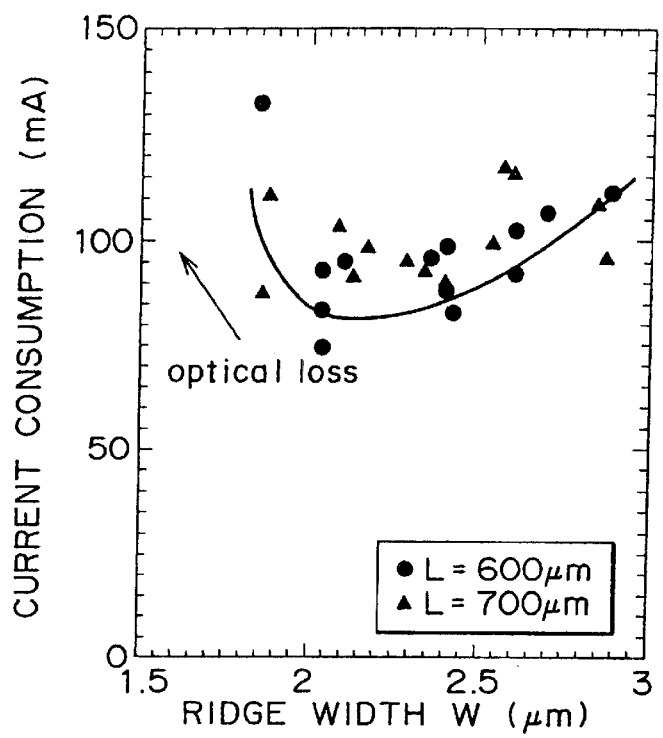
FIG. 3 is a graph showing a relationship between a current consumption of the semiconductor light emitting device and a ridge width.

FIG. 3 shows a relationship between the ridge width W and a current consumption necessary for obtaining an output of 30 mW, wherein the ordinate designates the current consumption and the abscissa designates the ridge width W. In the figure, black circular marks show data obtained for the device 1 having a resonator length L=600 μm and black triangular marks show data obtained for the device 1 having a resonator length L=700 μm.

As shown in FIG. 3, when the ridge width W is in a range of 1.9 to 2.6 μm, the current consumption becomes about 100 mA or less. In particular, the ridge width W is preferably in a range of 2.1 to 2.4 μm. If the ridge width W is narrower than 1.9 μm or wider than 2.6 μm, the current consumption becomes more than 100 mA, and particularly, if the ridge width becomes narrower than 1.9 μm, the current consumption becomes rapidly higher, leading to a cause for an operational failure due to heat generation.

Figure 4:
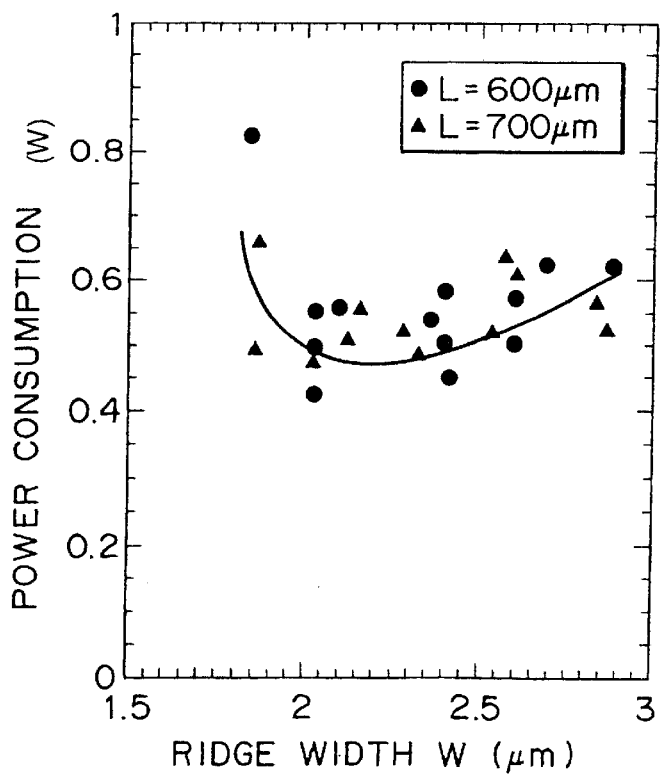
FIG. 4 is a graph showing a relationship between a power consumption of the semiconductor light emitting device and a ridge width.

FIG. 4 shows a relationship between the ridge width W and a power consumption necessary for obtaining an output of 30 mW, wherein the ordinate designates the power consumption and the abscissa designates the ridge width W. In the figure, black circular marks show data obtained for the device 1 having a resonator length L=600 μm and black triangular marks show data obtained for the device 1 having a resonator length L=700 μm.

As shown in FIG. 4, when the ridge width W is in a range of 1.9 to 2.6 μm, the power consumption becomes about 0.6 W or less. In particular, when the ridge width W is in a range of 2.0 to 2.4 μm, the power consumption certainly becomes less than 0.6 W. If the ridge width W is narrower than 1.9 μm or wider than 2.6 μm, the power consumption becomes more than 0.6 W, and particularly, if the ridge width W is narrower than 1.9 μm, the power consumption becomes rapidly higher, failing to achieve the purpose of reducing the power consumption.

Figure 5:
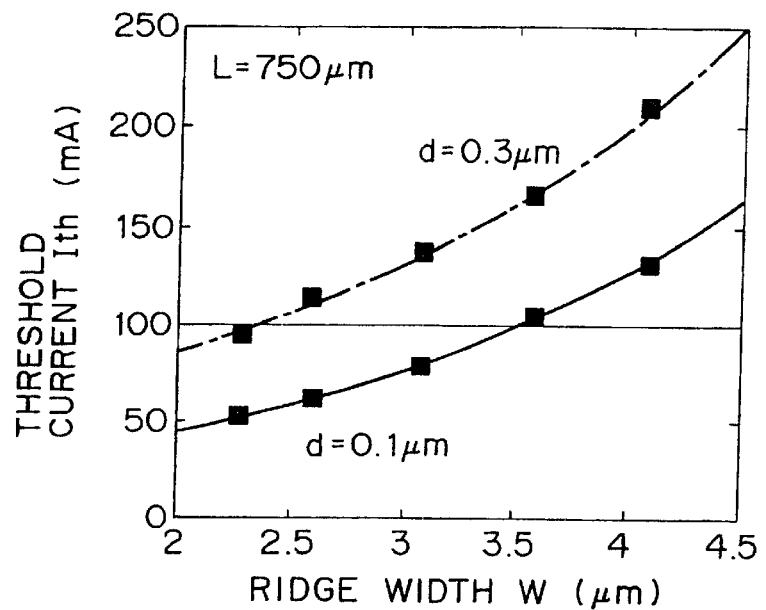
FIG. 5 is a graph showing a relationship between a threshold current and a ridge width.

FIG. 5 shows a relationship between the ridge width W and a threshold current $I_{th}$ of the semiconductor light emitting device having a resonator length L=750 μm, wherein the ordinate designates the threshold current $I_{th}$ upon continuous oscillation and the abscissa designates the ridge width W. In the figure, a dashed line shows data obtained for the device 1 in which the thickness "d" of portions, on both sides of the ridge, of a semiconductor layer is 0.1 μm, and a solid line shows data obtained for the device 1 in which the thickness "d" is 0.3 μm.

To stably operate the semiconductor light emitting device, the threshold current $I_{th}$ must be set in a range of 100 mA or less. As shown in FIG. 5, for the device 1 in which the thickness "d" is 0.3 μm, to set the threshold current $I_{th}$ to 100 mA or less, the ridge width W must be set to 2.3 μm or less, and for the device 1 in which the thickness "d" is 0.1 μm, to set the threshold current $I_{th}$ to 100 mA or less, the ridge width W must be set to 3.5 μm or less.

The thickness "d" of the portions, on both sides of the ridge 21, of the semiconductor layer 20 will be described in detail below. As the thickness "d" becomes thicker, a current flowing from the ridge 21 flows toward the portions, on both the sides of the ridge 21, of the semiconductor layer 20, so that the amount of the current flowing in a light emitting region becomes smaller. As a result, the current efficiency becomes lower and the threshold current $I_{th}$ becomes higher. On the other hand, the thickness "d" becomes thinner, a current flowing from the ridge 21 less flows toward the portions, on both the sides of the ridge 21, of the semiconductor layer 20, and thereby the current efficiently flows in the light emitting region. As a result, the amount of the current flowing in the light emitting region becomes larger, so that the current efficiency becomes higher and the threshold current $I_{th}$ becomes lower.

Further, as the thickness "d" becomes thinner, a differential refractive index $\Delta n = n_{2-n1}$ ($n_2$ is an effective refractive index of a portion directly under the ridge 21 and $n_1$ is an effective refractive index of a portion composed of the semiconductor layer 20, active layer 16, n-type guide layer 15, and n-type cladding layer 14) becomes larger. If the differential refractive index $\Delta n$ becomes, for example, $3 \times 10^{-3}$ or more, the confinement of light in the lateral direction becomes sufficiently stronger, so that the stimulated emission of light efficiently occurs, with a result that the threshold current $I_{th}$ becomes lower.

Figure 6:
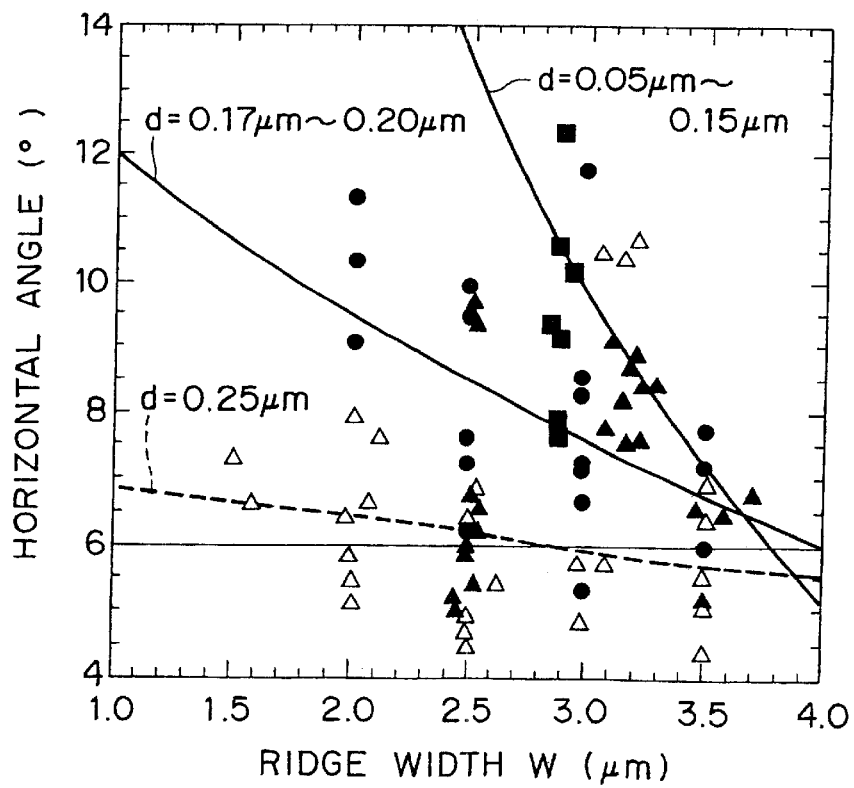
FIG. 6 is a graph showing a relationship between a horizontal angle and a ridge width.

FIG. 6 shows a relationship between a horizontal angle θ (or a half-value of a far-field pattern in the horizontal direction) and the ridge width W, with the thickness "d" of the portions, on both the sides of the ridge 21, of the semiconductor layer 20 taken as a parameter, wherein the ordinate designates the horizontal angle θ and the abscissa designates the ridge width W.

As shown in FIG. 6, where the ridge width W is in the above-described range of 1.9 to 2.6 μm, when the thickness "d" is in a range of 0.03 to 0.25 μm, the average horizontal angle θ becomes 6.0° or more, and particularly, when the thickness "d" is in a range of 0.03 to 0.20 μm, the average horizontal angle θ becomes 8° or more, and becomes 6° or more even in consideration of variations thereof. Additionally, the thickness "d" can be made smaller than 0.03 μm; however, in the case of forming the ridge 21 by etching the p-type cladding layer 19, the p-type cladding layer 19 must have a thickness of about 0.03 μm in order to prevent occurrence of an etching damage in the active layer 16 upon etching of the p-type cladding layer 19. For this reason, the thickness "d" is set to about 0.03 μm or more. If the ridge 21 can be formed by etching without occurrence of any etching damage, the thickness "d" can be reduced to less than 0.03 μm.

As described above, the ridge width W must be in the range of at least 1.9 to 2.6 μm, preferably, in the range of 2.1 to 2.4 μm. The thickness "d" is preferably in the range of 0.03 to 0.25 μm.

According to the semiconductor light emitting device 1, a lateral mode of a light intensity distribution can be stably kept in the lateral direction by providing the current blocking layer 23 which is made from a low refractive index material having a refractive index of 2.5 or less, preferably, silicon oxide or silicon nitride having a refractive index of 1.7 or less.

By the way, it has been known that the refractive index of a gallium nitride based material is not changed so much even if aluminum is added thereto; however, it has not been appointed that the ridge width W and the thickness "d" of the portions, on both the sides of the ridge 21, of the semiconductor layer 20 exert a large effect on a refractive index distribution in the lateral direction. From this viewpoint, according to the semiconductor light emitting device 1, by providing the current blocking layer 23 made from a low refractive index material and specifying the ridge width W and the thickness "d" as described above for stably confining light in the X-direction (that is, lateral direction), it is possible to reduce the threshold value (specifically, reduce the threshold current $I_{th}$ to 100 mA or less) and also increase the far-field pattern (specifically, increase the half-value θ of the far-field pattern in the horizontal direction to 6.0° or more). Further, by properly selecting the ridge width W and the thickness "d" of the semiconductor layer, the half-value θ can be increased to 8° or more. In this way, the semiconductor light emitting device of the present invention can be used for an optical disk apparatus such as a digital versatile disk (DVD) apparatus, particularly, used for a high density optical disk apparatus.

It should be noted that the half-value θ of the far-field pattern in the horizontal direction is expressed by an angle at which a light intensity of 50% or more of a peak light intensity can be obtained in a horizontal intensity distribution of light emitted from the semiconductor light emitting device.

The above-described configuration of the present invention can be applied to gallium nitride based semiconductor light emitting devices including the so-called ridges other than the semiconductor light emitting device described in the embodiment.

While the preferred embodiment of the present invention has been described using specific terms, such description is for illustrative purposes only, and it is to be understood that changes and variations may be made without departing from the spirit or scope of the following claims.

What is claimed is:

1. A semiconductor light emitting device comprising:
   a cladding layer having a first conductive type, an active layer, and a semiconductor layer including at least a cladding layer and having a second conductive type reversed to the first conductive type, which layers are sequentially stacked on a substrate;
   wherein a ridge is formed on part of an upper portion of said semiconductor layer;
   each of said cladding layer having the first conductive type, said active layer, and said semiconductor layer having the second conductive type is made from a nitride based group III–V compound semiconductor; and
   the width of said ridge is in a range of 1.9 to 2.6 μm.

2. The semiconductor light emitting device according to claim 1, wherein the thickness of a portion, present on a side of said size, of said semiconductor layer is in a range of 0.03 to 0.25 μm.

3. The semiconductor light emitting device according to claim 1, wherein a current blocking layer for blocking a current from flowing in the direction from said semiconductor layer to said active layer is formed on at least a portion, present on a side of said ridge, of said semiconductor layer.

4. The semiconductor light emitting device according to claim 2, wherein a current blocking layer for blocking a current from flowing in the direction from said semiconductor layer to said active layer is formed on at least a portion, present on a side of said ridge, of said semiconductor layer.

5. The semiconductor light emitting device according to claim 1 wherein the thickness of a portion, present on a side of said ridge, of said semiconductor layer is in a range of 0.3 to 0.33 μm for a ridge width of 1.9 μm, and in a range of 0.03 to 0.295 μm for a range width of 2.6 μm.

6. The semiconductor light emitting device according to claim 1, wherein current consumption to obtain an output of 30 mW is 100 mA or less for said range of width.

7. The semiconductor light emitting device as set forth in claim 2, wherein said current consumption to obtain an output of 30 mW is 100 mA or less for said range of ridge width.

8. The semiconductor light emitting device as set forth in claim 5, wherein said current consumption to obtain an output of 30 mW is 100 mA or less for said range of ridge width.

9. The semiconductor light emitting device as set forth in claim 1, wherein said power consumption to obtain an output of 30 mW is about 0.6 W or less for said range of ridge width.

10. The semiconductor light emitting device as set forth in claim 2, wherein said power consumption to obtain an output of 30 mW is about 0.6 W or less for said range of ridge width.

11. The semiconductor light emitting device as set forth in claim 5, wherein said power consumption to obtain an output of 30 mW is about 0.6 W or less for said range of ridge width.

12. The semiconductor light emitting device as set forth in claim 6, wherein said power consumption to obtain an output of 30 mW is about 0.6 W or less for said range of ridge width.

13. A semiconductor light emitting device as set forth in claim 7, wherein said power consumption to obtain a output of 30 mW is about 0.6 W or less for said range of ridge width.

14. The semiconductor light emitting device as set forth in claim 8, wherein said power consumption to obtain an output of 30 mW is about 0.6 W or less for said range of ridge width.

* * * * *